United States Patent
Miyatake et al.

(10) Patent No.: US 6,947,105 B2
(45) Date of Patent: Sep. 20, 2005

(54) ORGANIC ELECTROLUMINESCENT DEVICE, POLARIZING SURFACE LIGHT SOURCE, AND LIQUID-CRYSTAL DISPLAY

(75) Inventors: Minoru Miyatake, Osaka (JP); Tatsuki Nagatsuka, Osaka (JP)

(73) Assignee: Nitto Denko Corporation, Osaka (JP)

( * ) Notice: Subject to any disclaimer, the term of this patent is extended or adjusted under 35 U.S.C. 154(b) by 184 days.

(21) Appl. No.: 09/759,339

(22) Filed: Jan. 16, 2001

(65) Prior Publication Data

US 2002/0008807 A1 Jan. 24, 2002

(30) Foreign Application Priority Data

Jan. 17, 2000 (JP) .................................. P.2000-007956

(51) Int. Cl.[7] .......................................... G02F 1/1335
(52) U.S. Cl. .......................................... 349/69; 349/61
(58) Field of Search ............................ 349/61, 65, 69; 359/494

(56) References Cited

U.S. PATENT DOCUMENTS

| | | | |
|---|---|---|---|
| 2,123,902 A | | 7/1938 | Land |
| 5,751,388 A | | 5/1998 | Larson ..................... 349/96 |
| 5,940,211 A | | 8/1999 | Hikmet et al. |
| 5,955,837 A | | 9/1999 | Horikx et al. |
| 6,025,894 A | * | 2/2000 | Shirasaki et al. ............. 349/69 |
| 6,111,696 A | * | 8/2000 | Allen et al. .................. 359/495 |
| 6,461,775 B1 | * | 10/2002 | Pokorny et al. ............... 430/7 |

FOREIGN PATENT DOCUMENTS

| | | | |
|---|---|---|---|
| EP | 0 952 477 A1 | 10/1999 | |
| JP | 6-160842 | 6/1994 | ......... G02F/1/1335 |
| JP | 8-83688 | 3/1996 | ........... H05B/33/26 |
| JP | 09274108 | 10/1997 | |
| JP | 10-321371 | 12/1998 | ........... H05B/33/14 |

* cited by examiner

*Primary Examiner*—Tarifur R. Chowdhury
*Assistant Examiner*—Prasad R. Akkapeddi
(74) *Attorney, Agent, or Firm*—Sughrue Mion, PLLC

(57) ABSTRACT

An organic electroluminescent device containing an organic electroluminescent element (2) and a polarized-light scattering film (1) which comprises a light-transmitting resin (11) and dispersedly contained therein minute regions (12) differing from the light-transmitting resin in birefringent characteristics and in which the difference in refractive index between the minute regions and the light-transmitting resin in the axis direction in which a linearly polarized light has a maximum transmittance, $\Delta n^1$, is smaller than 0.03 and that in a direction perpendicular to the $\Delta n^1$ direction, $\Delta n^2$, is from 0.03 to 0.5, the light produced by the organic electroluminescent element being emitted from the device through the polarized-light scattering film. Also disclosed are a polarizing surface light source which comprises the organic electroluminescent device and a liquid-crystal display which comprises the polarizing surface light source and a liquid-crystal cell disposed on the light emission side of the light source.

9 Claims, 2 Drawing Sheets

ORGANIC ELECTROLUMINESCENT DEVICE, POLARIZING SURFACE LIGHT SOURCE, AND LIQUID-CRYSTAL DISPLAY

FIELD OF THE INVENTION

The present invention relates to an organic electroluminescent device having an excellent light emission efficiency and attains high brightness, and to a polarizing surface light source and a liquid-crystal display each employing the electroluminescent device.

BACKGROUND OF THE INVENTION

Various luminescent devices have hitherto been proposed which employ an organic electroluminescent (EL) element comprising electrodes and interposed therebetween a luminescent layer comprising an organic EL material. As compared with inorganic EL elements, the organic EL elements themselves luminesce upon application of a lower voltage, have a higher degree of freedom of material design, and can be more easily made thin. The organic EL elements are hence expected to be used as surface light sources for use as, for example, the backlights of liquid-crystal displays.

However, the conventional organic EL devices have had a problem that the efficiency of light utilization is low. Specifically, the efficiency of emission η of light generated by a luminescent layer (efficiency of taking out the light) is approximated using the equation η=½n², wherein n is the refractive index of the luminescent layer. Supposing that n is 1.6, the value of η is about 0.2, i.e., the efficiency of emission is as low as about 20%. It has been proposed to heighten the efficiency of emission by a technique in which the light generated in an element is transmitted by total internal reflection and emitted through an edge of the element, by a technique in which a luminescent layer comprising a discotheque liquid crystal is formed to enhance light emission toward the front side, or by a technique in which a light diffuser film is disposed outside an element to reduce total internal reflection (see JP-A-6-160842 (the term "JP-A" as used herein means an "unexamined published Japanese patent application"), JP-A-10-321371, and JP-A-8-83688). However, these techniques have drawbacks of complicated constitution, device instability, insufficient efficiency of emission, etc., and none of them is a satisfactory measure for resolution.

SUMMARY OF THE INVENTION

An object of the invention is to provide an organic EL device which has a simple constitution, is excellent in device stability and emission efficiency, and attains high brightness.

The invention provides an organic EL device comprising an organic EL element and a polarized-light scattering film which comprises a light-transmitting resin and dispersedly contained therein minute regions differing from the light-transmitting resin in birefringent characteristics and in which the difference in refractive index between the minute regions and the light-transmitting resin in the axis direction in which a linearly polarized light has a maximum transmittance, $\Delta n^1$, is smaller than 0.03 and that in a direction perpendicular to the $\Delta n^1$ direction, $\Delta n^2$, is from 0.03 to 0.5, the light produced by the organic EL element being emitted from the device through the polarized-light scattering film. The invention further provides a polarizing surface light source which comprises the organic EL device and which has an illuminating planar surface and emits a polarized light. The invention furthermore provides a liquid-crystal display which comprises the polarizing surface light source and a liquid-crystal cell disposed on the light emission side of the light source.

According to the invention, when the EL light formed by the luminescent layer enters the polarized-light scattering film, the linearly polarized light having a vibration plane parallel to a $\Delta n^2$ direction for the film is scattered and comes not to satisfy the total internal reflection conditions, and is hence efficiently emitted from the device. On the other hand, the light remaining in the device is confined therein by means of the effect of total internal reflection. While the light confined repeatedly undergoes reflection and transmission, the polarized state thereof is eliminated and the light waits for a chance of the emission. Consequently, according to the organic EL device of the invention, the light formed by the organic EL element can be efficiently emitted from the device through the polarized-light scattering film, and the light emitted has polarization. The EL device of the invention can therefore be utilized as a polarizing surface light source. Furthermore, the device has a simple constitution containing a polarizing-light scattering film and has excellent stability. The EL device can be used to fabricate a liquid-crystal device having high brightness and satisfactory display quality.

1: polarized-light scattering film

11: light-transmitting resin

12: minute region

2: organic EL element

21: electrode substrate 22, 24: electrode

23: luminescent layer 3, 4, 5: optical part

Figure 2:
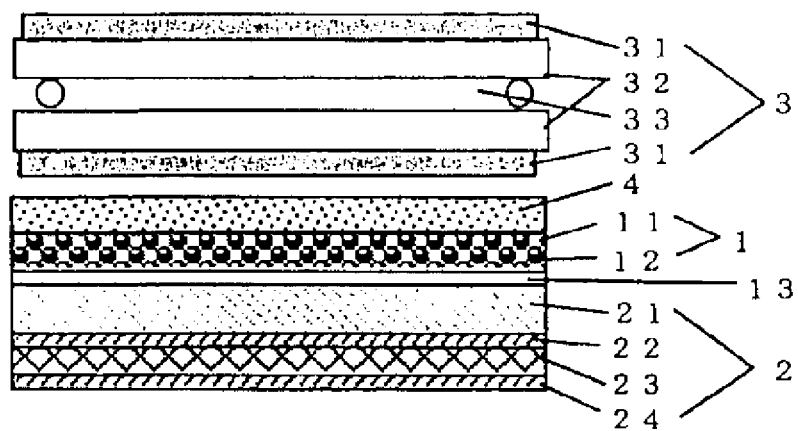

FIG. 2 is directed to the embodiment of a liquid crystal display.

In the drawing:

6: Liquid crystal display

31: Polarizing film

32: Electrode-provided substrate

33: Liquid crystal

DETAILED DESCRIPTION OF THE INVENTION

Figure 1:
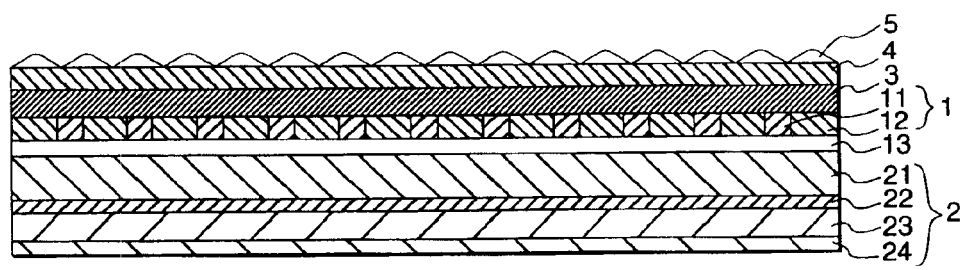
FIG. 1 is a sectional view of one embodiment of the organic EL device.

The organic EL device of the invention comprises an organic EL element and a polarized-light scattering film which comprises a light-transmitting resin and dispersedly contained therein minute regions differing from the light-transmitting resin in birefringent characteristics and in which the difference in refractive index between the minute regions and the light-transmitting resin in the axis direction in which a linearly polarized light has a maximum transmittance, $\Delta n^1$, is smaller than 0.03 and that in a direction perpendicular to the $\Delta n^1$ direction, $\Delta n^2$, is from 0.03 to 0.5, the light produced by the organic EL element being emitted from the device through the polarized-light scattering film. An embodiment of the organic EL device is shown in FIG. 1, wherein numeral 1 denotes a polarized-light scattering film, 11 a light-transmitting resin, 12 a minute region, 2 an organic EL element, 21 an electrode substrate, 22 and 24 each an electrode, and 23 a luminescent layer. Numeral 13 denotes an adhesive layer consisting of a pressure-sensitive adhesive layer.

For forming the polarized-light scattering film, the following method can, for example, be used. One or more light-transmitting resins are mixed with one or more appropriate materials for forming minute regions, e.g., polymers or liquid crystals, which are highly transparent and differ from the light-transmitting resins in birefringent characteristics. From this mixture is formed a film consisting of the light-transmitting resins dispersedly containing the materials as minute regions. According to need, this film is subjected to an appropriate orientation treatment such as stretching to form regions having different birefringent characteristics.

The light-transmitting resins are not particularly limited, and suitable transparent resins can be used. Examples thereof include polyester resins, styrene resins such as polystyrene and acrylonitrile/styrene copolymers (AS polymers), olefin resins such as polyethylene, polypropylene, ethylene/propylene copolymers, and polyolefins having cyclic or norbornene structures, carbonate resins, acrylic resins, vinyl chloride resins, cellulosic resins, amide resins, imide resins, sulfone resins, polyethersulfone resins, polyetheretherketone resins, poly(phenylene sulfide) resins, vinyl alcohol resins, vinylidene chloride resins, vinyl butyral resins, acrylate resins, polyoxymethylene resins, silicone resins, urethane resins, and blends of these. Examples thereof further include thermosetting or ultraviolet-curable polymers such as phenolic, melamine, acrylic, urethane, urethane-acrylic, epoxy, and silicone polymers.

Consequently, the light-transmitting resins may be ones which are less apt to have orientational birefringence attributable to molding strain or the like (isotropic polymers), or may be ones which are apt to have such orientational birefringence (anisotropic polymers). Preferred are resins which are highly transparent in the visible region. Preferred from the standpoint of heat resistance are resins having a deformation-under-load temperature of 80° C. or higher and a glass transition temperature of 110° C. or higher, preferably 115° C. or higher, more preferably 120° C. or higher. The deformation-under-load temperature is measured in accordance with JIS K 7207 through a test in which a test piece having a height of 10 mm placed in a heating bath is heated by heating the heating medium at a rate of 2° C./min while imposing a bending stress of 18.5 kgf/cm$^2$ on the test piece. The deformation-under-load temperature of the test piece is defined as the temperature of the heating medium at the time when the amount of deflection of the test piece has reached 0.32 mm.

As the materials for forming minute regions, suitable polymers, liquid crystals, or the like can be used which form regions differing in birefringent characteristics from the light-transmitting resin to be used in combination therewith. Examples of such combinations include a combination of a polymer and a liquid crystal, a combination of an isotropic polymer and an anisotropic polymer, and a combination of anisotropic polymers. From the standpoint of even distribution of minute regions, it is preferred to use a combination which undergoes phase separation. The distribution of minute regions can be regulated by selecting a combination of materials having a suitable degree of compatibility. Phase separation can be accomplished by a suitable technique such as a method in which incompatible materials are dissolved in a solvent to prepare a solution thereof or a method in which incompatible materials are melt-mixed with each other with heating.

In the case where a film consisting of a combination of a polymer and a liquid crystal or a combination of an isotropic polymer and an anisotropic polymer is oriented by stretching, a polarized-light scattering film having the desired properties can be formed by conducting the stretching at any desired temperature and any desired stretch ratio. In the case of a film consisting of a combination of anisotropic polymers, a polarized-light scattering film having the desired properties can be formed by stretching it under suitably regulated conditions. Although anisotropic polymers are classified as positive or negative polymers by change in stretch-direction refractive index, either positive or negative anisotropic polymers can be used in the invention. Either a combination of positive or negative anisotropic polymers or a combination of a positive anisotropic polymer and a negative anisotropic polymer can be used.

Examples of the polymers include the light-transmitting resins enumerated above. On the other hand, examples of the liquid crystals include low molecular weight liquid crystals and crosslinkable liquid-crystal monomers which both show a nematic or smectic phase at room or high temperatures, such as cyanobiphenyl, cyanophenylcyclohexane, cyanophenyl ester, phenyl benzoate, and phenylpyrimidine type liquid crystals and mixtures of these, and liquid-crystal polymers showing a nematic or smectic phase at room or high temperatures. Those crosslinkable liquid-crystal monomers are usually oriented and then crosslinked by appropriate means such as heat or light to give polymers.

From the standpoint of obtaining a polarized-light scattering film excellent in heat resistance, durability, and other properties, it is preferred to use a polymer having a glass transition temperature of 50° C. or higher, preferably 80° C. or higher, more preferably 120° C. or higher or to use a crosslinkable liquid-crystal monomer or a liquid-crystal polymer. The kind of the liquid-crystal polymer is not particularly limited, and an appropriate liquid-crystal polymer of the main chain type or side chain type can be used. A liquid-crystal polymer advantageously usable from the standpoints of the formation of minute regions having excellent uniformity in particle diameter and of thermal stability, suitability for film formation, ease of orientation, etc. is one having a degree of polymerization of 8 or higher, preferably 10 or higher, more preferably from 15 to 5,000.

For forming a polarized-light scattering film using one or more liquid-crystal polymers, the following method can, for example, be used. One or more light-transmitting resins are mixed with one or more liquid-crystal polymers for forming minute regions. From this mixture is formed a film dispersedly containing the liquid-crystal polymers as minute regions. This film is oriented by an appropriate technique to form regions having different birefringent characteristics. In this case, from the standpoint of regulating the refractive index differences $\Delta n^1$ and $\Delta n^2$ through orientation, it is preferred to use liquid-crystalline thermoplastic resins which have a glass transition temperature of 50° C. or higher and show a nematic liquid-crystal phase in a range of temperatures lower than the glass transition temperatures of the light-transmitting resins to be used in combination therewith. Examples thereof include side chain type liquid-crystal polymers having monomer units represented by the following general formula:

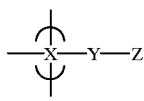

wherein X is a backbone group which constitutes the main chain of the liquid-crystal polymer and may be formed by appropriate linkage groups such as linear, branched, or cyclic groups. Examples thereof include polyacrylates, polymethacrylates, poly(α-haloacrylate)s, poly(α-cyanoacrylate)s, polyacrylamides, polyacrylonitriles, polymethacrylonitriles, polyamides, polyesters, polyurethanes, polyethers, polyimides, and polysiloxanes.

Y is a spacer group branching from the main chain. From the standpoint of forming a polarized-light scattering film while regulating refractive index and from other standpoints, preferred examples of the spacer group Y include ethylene, propylene, butylene, pentylene, hexylene, octylene, decylene, undecylene, dodecylene, octadecylene, ethoxyethylene, and methoxybutylene.

On the other hand, Z is a mesogenic group imparting the property of liquid-crystalline alignment. Examples thereof include the following groups. The terminal substituent A in the following groups may be an appropriate substituent such as a cyano, alkyl, alkenyl, alkoxy, or oxaalkyl group or an alkyl, alkoxy, or alkenyl group in which one or more of the hydrogen atoms are replaced with fluorine or chlorine atoms.

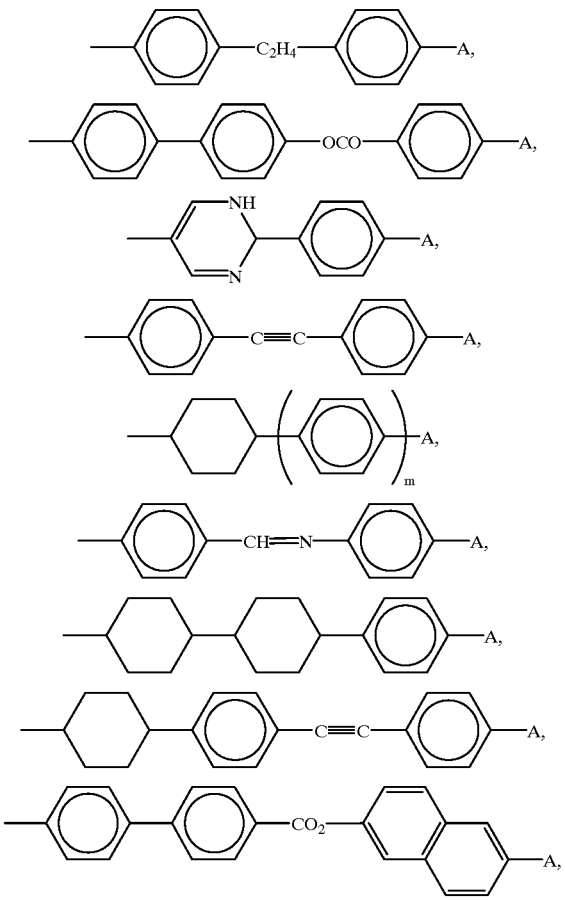

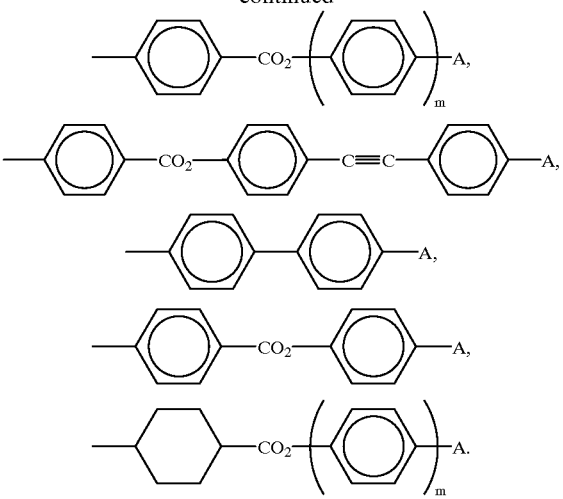

In those monomer units, the spacer group Y and the mesogenic group Z may be bonded to each other through an ether bond, —O—. Furthermore, in the phenyl groups contained in the mesogenic group Z, one or two hydrogen atoms may be replaced with a halogen. In this case, the halogen is preferably chlorine or fluorine. The side chain type liquid-crystal polymers undergoing nematic orientation may be any appropriate thermoplastic resins such as homo- or copolymers having monomer units represented by the general formula given above. Preferred among these polymers are those excellent in monodomain orientation.

For forming a polarized-light scattering film containing a nematic liquid-crystal polymer, the following method can, for example, be used. A light-transmitting resin for film formation is mixed with a liquid-crystal polymer which shows a nematic liquid-crystal phase in a range of temperatures lower than the glass transition temperature of the light-transmitting resin and has a glass transition temperature of 50° C. or higher, preferably 60° C. or higher, more preferably 70° C. or higher. From this mixture is formed a film dispersedly containing the liquid-crystal polymer as minute regions. Thereafter, the liquid-crystal polymer constituting these minute regions is heated to bring the polymer into a nematic liquid-crystal phase, and this orientation is fixed by cooling.

The film dispersedly containing minute regions, i.e., the film to be oriented, can be obtained by an appropriate technique such as casting, extrusion molding, injection molding, rolling, or flow casting. It is also possible to obtain the film by spreading a monomer mixture and polymerizing the spread mixture by heating or irradiation with, e.g., ultraviolet.

From the standpoint of obtaining a polarized-light scattering film containing highly evenly distributed minute regions and from other standpoints, a preferred method is to use a solution of raw materials in a solvent to form a film therefrom through casting, flow casting, or another technique. In this case, the size and distribution of minute regions can be regulated by changing the kind of the solvent, viscosity of the solution, rate of drying of the spread solution layer, etc. For example, an advantageous technique for reducing the area of minute regions is to use a solution having a reduced viscosity or to dry a spread solution layer at an increased rate.

The thickness of the film to be oriented can be suitably determined. However, from the standpoints of suitability for orientation and others, the thickness thereof is generally from 1 μm to 3 mm, preferably from 5 μm to 1 mm, more preferably from 10 to 500 μm. In forming the film, appropriate additives can be incorporated, such as a dispersant, surfactant, ultraviolet absorber, color tone regulator, flame retardant, release agent, and antioxidant.

Orientation can be accomplished by conducting one or more appropriate treatments capable of regulating refractive index through orientation, as described above. Examples of the orientation treatments include: stretching treatments such as uni- or biaxial stretching, successive biaxial stretching, and stretching along a Z axis; a rolling treatment; a technique in which an electric or magnetic field is applied to the film held at a temperature not lower than the glass transition temperature or liquid-crystal transition temperature thereof and the film is then rapidly cooled to fix the orientation; a technique in which polymer molecules are oriented during film formation by means of flow orientation; and a technique in which a liquid crystal is caused to orient by itself based on the slight orientation of an isotropic polymer. Consequently, the polarized-light scattering film obtained may be a stretched film or unstretched film. Although a brittle light-transmitting resin can be used in obtaining a stretched film, it is especially preferred to use a light-transmitting resin having excellent stretchability.

In the case of a film containing a liquid-crystal polymer as minute regions, orientation can be accomplished by, for example, a method comprising heating the film to a temperature at which the liquid-crystal polymer dispersedly contained therein as minute regions melts and shows the desired liquid-crystal phase, e.g., nematic phase, orienting the molecules of the liquid-crystal polymer under the influence of an orientation-regulating force, and then rapidly cooling the film to fix the oriented state. Preferably, this oriented state of the minute regions is as close as possible to a monodomain state, for example, from the standpoint of eliminating fluctuations of optical properties. The orientation-regulating force to be used can be an appropriate force capable of orienting the liquid-crystal polymer. Examples thereof include a stretching force which is applied by stretching the film in an appropriate stretch ratio, a shearing force applied during film formation, an electric field, and a magnetic field. One or more of such orientation-regulating forces can be used to orient the liquid crystal polymer.

Consequently, the part other than the minute regions in the polarized-light scattering film may be birefringent or isotropic. A polarized-light scattering film which is wholly birefringent can be obtained, for example, by using a resin which becomes birefringent upon orientation as a film-forming light-transmitting resin and conducting molecular orientation or the like during film formation as described above. According to need, known means for orientation such as stretching can be further conducted to impart or control birefringence. On the other hand, a polarized-light scattering film in which the part other than the minute regions is isotropic can be obtained, for example, by using an isotropic resin as a film-forming light-transmitting resin and stretching a film thereof at a temperature not higher than the glass transition temperature of the light-transmitting resin.

The polarized-light scattering film according to the invention is regulated in refractive index differences in in-plane optical-axis directions, $\Delta n^1$ and $\Delta n^2$, between the minute regions and the light-transmitting resin. Specifically, the difference in refractive index between the minute regions and the light-transmitting resin in the axis direction in which a linearly polarized light has a maximum transmittance, $\Delta n^1$, is smaller than 0.03 and that in a direction perpendicular to the $\Delta n^1$ direction, $\Delta n^2$, is from 0.03 to 0.5. By regulating the optical film so as to have such properties, the film can have the excellent ability to scatter light in $\Delta n^2$ directions and, in the $\Delta n^1$ direction, it enables the light to maintain a polarized state and pass therethrough without being deflected. Namely, the film can attain satisfactory anisotropy in scattering. From the standpoint of anisotropy in the scattering of a linearly polarized light, the difference in refractive index in the $\Delta n^2$ direction, $\Delta n^2$, is preferably from 0.035 to 0.45, more preferably from 0.040 to 0.40, most preferably from 0.05 to 0.30.

The size of the minute regions is not particularly limited, and is generally about from 0.05 to 300 μm. From the standpoint of widening the scattering angle and effectively enabling the light not to meet the critical conditions for total internal reflection to thereby improve the efficiency of emission, the $\Delta n^2$-direction length of the minute regions is preferably not shorter than the wavelengths of visible light, more preferably from 0.5 to 50 μm, most preferably from 1 to 25 μm. Although the minute regions are present usually as domains in the polarized-light scattering film, they are not particularly limited in their lengths in the $\Delta n^1$ and other directions.

The content by volume of the minute regions in the polarized-light scattering film also is not particularly limited, and is generally about from 0.5 to 80%. From the standpoint of inhibiting backward scattering, it is preferred to regulate the content thereof by volume to generally 50% or lower, preferably 40% or lower, more preferably from 1 to 30%. The minute regions are preferably dispersed and distributed as evenly as possible in the film from the standpoints of homogeneity of the scattering effect, etc.

In a polarized-light scattering film which is preferred from the standpoints of the efficiency of light utilization, perceptibility, and others, the diffuse reflectance of linearly polarized light in a $\Delta n^2$ direction is generally 20% or lower, preferably 10% or lower, more preferably 5% or lower, the total transmittance of linearly polarized light in the $\Delta n^2$ direction is generally 70% or higher, preferably 80% or higher, more preferably 90% or higher, and the total transmittance of linearly polarized light in the $\Delta n^1$ direction, in which linearly polarized light is less scattered, is generally 80% or higher, preferably 85% or higher, more preferably 90% or higher.

In the case where the light-transmitting resin constituting the film is optically isotropic, the difference in refractive index between the minute regions with respect to each optical axis direction and the part other than the minute regions means the difference between the refractive index of the minute regions in each optical axis direction and the average refractive index of the film. In the case where the light-transmitting resin constituting the film is optically anisotropic, that difference in refractive index means the difference in refractive index in each axis direction between the minute regions and the resin because the direction of the main optical axis for the film usually coincides with the direction of the main optical axis for the minute regions.

A multilayer structure comprising two or more superposed layers of the polarized-light scattering film may be used. This superposition can bring about a synergistic scattering effect higher than the scattering effect expected from the thickness increase. This multilayer structure may be obtained by superposing polarized-light scattering films while positioning each film at any desired angle with respect to, e.g., the $\Delta n^1$ or $\Delta n^2$ directions. However, from the standpoints of enhancing the scattering effect, etc., it is preferred to superpose the films in such a manner that the $\Delta n^2$ directions for any film layer are parallel to those for the adjacent layers. The number of superposed polarized-light scattering films can be appropriate number of 2 or larger.

The polarized-light scattering films to be superposed may have the same or different values of $\Delta n^1$, $\Delta n^2$, etc. With respect to the parallelism in, e.g., $\Delta n^2$ direction between adjacent layers, fluctuations of parallelism caused by operational errors are allowable, although a higher degree of parallelism is preferred. In the case of a layer having fluctuations in, e.g., $\Delta n^2$ direction, the parallelism is based on the average of these. In the multilayer structure, the polarized-light scattering films may be in a merely stacked state. It is, however, preferred that the films have been bonded to each other through an adhesive layer or the like from the standpoints of preventing film shifting in, e.g., $\Delta n^2$ directions and preventing foreign substances from coming into each interface and from other standpoints. For the bonding, an appropriate adhesive can be used, such as a hot-melt or pressure-sensitive adhesive. From the standpoint of diminishing reflection loss, an adhesive layer whose refractive index is as close as possible to that of the polarized-light scattering films is preferred. It is also possible to bond the polarized-light scattering films with the same polymer as the resin constituting either the films or the minute regions.

From the standpoint of preventing a change in optical properties and other standpoints, it is preferred to use an adhesive which can be cured or dried without necessitating high-temperature processing or a prolonged treatment and which does not pose the problem of delamination under high-temperature or high-humidity conditions. From this standpoint, preferred examples of adhesives for use in the bonding include transparent pressure-sensitive adhesives such as acrylic, silicone, polyester, polyurethane, polyether, and rubber-based pressure-sensitive adhesives.

Especially preferred examples thereof include an acrylic pressure-sensitive adhesive comprising as the base polymer an acrylic polymer having a weight-average molecular weight of 100,000 or higher obtained by copolymerizing an alkyl (meth)acrylate having an alkyl group having 20 or less carbon atoms, such as methyl, ethyl, or butyl, with a modifier ingredient such as (meth)acrylic acid or hydroxyethyl (meth)acrylate in such a combination as to result in a glass transition temperature of 0° C. or lower. Acrylic pressure-sensitive adhesives have the advantage of being excellent in transparency, weatherability, heat resistance, and other properties.

For forming a pressure-sensitive adhesive layer on a polarized-light scattering film, an appropriate method can be used. Examples thereof include a method in which the components of a pressure-sensitive adhesive are dissolved or dispersed in an appropriate solvent to prepare an adhesive fluid and this adhesive fluid is directly applied on a polarized-light scattering film by an appropriate spreading technique, e.g., casting or coating, and a method in which a pressure-sensitive adhesive layer is formed on a separator in the manner shown above and is then transferred to a polarized-light scattering film. The pressure-sensitive adhesive layer to be formed may be composed of two or more superposed layers which differ in composition, kind, etc.

The thickness of the adhesive layer to be formed, e.g., pressure-sensitive adhesive layer, can be suitably determined according to the adhesive strength thereof, etc. The thickness thereof is generally from 1 to 500 $\mu$m, preferably from 5 to 100 $\mu$m. It is possible to incorporate a natural or synthetic resin, a filler comprising glass fibers, glass beads, or the like, and appropriate additives such as an antioxidant into the pressure-sensitive adhesive layer according to need. Furthermore, fine particles may be incorporated to form a pressure-sensitive adhesive layer having light-diffusing properties.

As described above, the organic EL device of the invention has a structure in which the EL light generated by the luminescent layer of the organic EL element enters the polarized-light scattering film and the linearly polarized light having a vibration plane parallel to a $\Delta n^2$ direction for the film is scattered and emitted from the device. Consequently, the polarized-light scattering film can be disposed in an appropriate position where the EL light generated by the luminescent layer can enter, such as, e.g., at an interface where the EL light is totally reflected or in a region where the EL light is transmitted. There are no particular limitations on the position of the polarized-light scattering film.

The polarized-light scattering film 1 can hence be superposed on and united with an electrode substrate 21 supporting an electrode 22 of the organic EL element 2, as shown in the figure. Alternatively, the polarized-light scattering film 1 can be used as the electrode substrate 21. From the standpoints of diminishing influences on the luminescent mechanism, ease of production, etc., it is especially preferred that the polarized-light scattering film 1 be superposed on and united with the electrode substrate 21 on its outer side as shown in the figure. If the polarized-light scattering film is disposed on a luminescent layer or buffer layer, this may result in a decrease in quantum efficiency or life, generation of dark spots, etc.

In the case where the polarized-light scattering film is superposed on and united with an electrode substrate as described above, the electrode supported on the electrode substrate is not limited. Specifically, in the case where an ordinary anode/cathode pair consisting of a combination of a metal electrode and a transparent electrode is used, the polarized-light scattering film can be superposed on the side of either electrode. For superposing the polarized-light scattering film on the electrode substrate to form a united structure, an appropriate adhesive can be used, such as, a layer of any of the pressure-sensitive adhesives shown above with regard to the superposition of polarized-light scattering films. It is, however, preferred in this case to employ a combination of an electrode substrate, an adhesive layer, and a polarized-light scattering film so that the differences in refractive index between these components are as small as possible, from the standpoint of improving emission efficiency, etc. In the case where the polarized-light scattering film is to be used as an electrode substrate, it should withstand an electrode-forming process and have excellent surface smoothness so as to enable the formation of a flat electrode.

The organic EL element is not particularly limited, and can be an appropriate one comprising a luminescent layer 23 made of an organic EL material interposed between electrodes 22 and 24 consisting of an anode and a cathode, as shown in the figure. Any of known organic EL elements can be used. Consequently, the EL element may be made capable of color displaying, for example, by forming an electron-transporting layer, such as a phenylbiphenyloxadiazole layer, between the luminescent layer and the cathode (see C. Adachi, S. Tokito, T. Tsutsui, S. Saito, *Jpn. J. Appl. Phy.*, Vol.27, L269(1988)) or by forming a constitution which contains a blue luminescent element and can emit lights of the three colors of red, green, and blue and thereby produce a white light (see JP-A-7-90260).

Furthermore, the organic EL element may be one in which the luminescent layer has undergone unidirectional orientation so as to obtain a polarized light (see P. Dyreklev et al., *Adv. Mater.*, 8, 146(1995) and J. H. Wendorff et al, *Liquid Crystal*, Vol.21, No.6, 903(1996)), or may be one which contains a fluorescence conversion material, dye, pigment, or the like in a constituent material and thereby emits a light of a different color. The organic EL device may have two or more organic EL elements.

As described above, the organic EL device of the invention can be used as a polarizing surface light source having an illuminating planar surface when it has a constitution in which a polarized light is emitted from the device through the polarized-light scattering film. In fabricating this EL device, one or more appropriate optical parts 3, 4, and 5 may be disposed in appropriate positions, for example, as shown in the figure. These optical parts may be in a merely stacked state or may have been bonded to each other through an adhesive layer or the like. With respect to this adhesive layer, the same explanation can be given as in the superposition of polarized-light scattering films.

There are no particular limitations on those optical parts, and appropriate ones may be used. Examples thereof include a polarizing film, a retardation film, a light diffuser film, a lens sheet, and a reflection plate. Such optical parts, including a polarizing film and a retardation film, may be any of various types. Specifically, examples of the polarizing film include absorption type, reflection type, and scattering type polarizing films, while examples of the retardation film include a quarter-wavelength plate, a half-wavelength plate, a retardation film comprising a uni—or biaxially or otherwise stretched film, one comprising a film which has undergone inclined orientation, i.e., which has undergone molecular orientation also in the thickness direction, one comprising a liquid-crystal polymer, one in which a phase difference caused by a viewing angle or birefringence is compensated for, and one comprising two or more of these retardation films superposed on each other. Any of these can be used in the invention.

Specific examples of the polarizing film include absorption type polarizing films such as films obtained by adsorbing iodine or a dichroic substance, e.g., a dichroic dye, onto a hydrophilic polymer film, such as a poly (vinyl alcohol) film, a film of poly (vinyl alcohol) which has undergone partial conversion into formal, or a film of a partially saponified ethylene/vinyl acetate copolymer, and then stretching the film and oriented polyene films such as a film of dehydrated poly(vinyl alcohol) and a film of dehydrochlorinated poly(vinyl chloride).

Examples of the polarizing film still further include a polarizing film comprising any of the aforementioned polarizing films and a transparent protective layer formed on one or each side thereof for the purpose of protection against water, etc. The protective layer may be, for example, a coating layer of a light-transmitting resin or a laminated film layer. The transparent protective layer may contain fine transparent particles having an average particle diameter of, e.g., from 0.5 to 20 $\mu$m so as to impart fine roughness to the surface of the polarizing film. Examples of such particles include fine inorganic particles which may be electroconductive, such as silica, alumina, titania, zirconia, tin oxide, indium oxide, cadmium oxide, and antimony oxide particles, and fine organic particles made of a crosslinked or uncrosslinked polymer.

On the other hand, specific examples of the retardation film include stretched films made of any of the resins enumerated hereinabove with regard to the polarized-light scattering film or made of a liquid-crystal polymer especially of the twisted alignment type. The light diffuser film serves to even the luminescence, while the lens sheet or a prism sheet serves to regulate the direction of light emission. These optical parts also may be appropriate conventional ones.

The polarizing film and the retardation film each may be disposed on either the light emission side or the opposite side of the organic EL device. However, the optical parts intended to regulate the angle of light emission, such as the light diffuser film and the lens sheet, are usually disposed on the light emission side of the organic EL device. In disposing a polarizing film and a retardation film, there are no particular limitations on the positions thereof relative to the polarized-light scattering film with respect to optical axes. In general, however, these optical parts are disposed in such a manner that the axis of transmission of the polarizing film or the axis of retardation of the retardation film is parallel or perpendicular to the $\Delta n^2$ directions for the polarized-light scattering film. The light diffuser film, lens sheet, and the like are preferably ones having the property of maintaining polarization so as to maintain the polarization of the light to be emitted.

On the other hand, in the case where the luminescent light partly comes out from that side of the organic EL device on which light utilization is not intended, a reflecting layer is disposed for the purpose of returning the light to the luminescent device and effectively utilizing it. Consequently, the reflecting layer is usually disposed on one side of the polarized-light scattering film or organic EL device. This reflecting layer also may be an appropriate conventional one such as, e.g., a metal layer having a mirror surface or a dielectric reflector plate.

As described above, the organic EL device may contain one optical part or two or more optical parts. The organic EL device may be one containing two or more superposed optical parts of the same kind, e.g., retardation films. In this case, these optical parts of the same kind, e.g., retardation films, may have the same or different properties. Such optical parts may be disposed in one or more appropriate positions outside or within the organic EL device, e.g., on one or each outer side thereof or on one or each side of a component of the organic EL device.

The polarizing surface light source of the invention emits a light having polarization corresponding to the $\Delta n^2$ directions as described above. Disposing a liquid-crystal cell on the light emission side of the light source gives a liquid-crystal display having excellent brightness and satisfactory display quality. The liquid-crystal cell is not particularly limited and may be an appropriate one.

EXAMPLE 1

In a 20 wt % dichloromethane solution containing 950 parts (parts by weight; the same applies hereinafter) of a norbornene resin having a deformation-under-load temperature of 165° C. and a glass transition temperature of 182° C. (Arton, manufactured by JSR Co., Ltd.) was dissolved 50 parts of a liquid-crystalline thermoplastic resin represented by the following formula which had a glass transition temperature of 80° C. and showed a nematic liquid-crystal phase in the temperature range of from 100 to 290° C. From this solution was obtained a 70 $\mu$m-thick film by casting. This film was stretched at 180° C. in a stretch ratio of 3 and then rapidly cooled to obtain a polarized-light scattering film having refractive index differences $\Delta n^1$ and $\Delta n^2$ of 0.029 and 0.230, respectively. The polarized-light scattering film obtained above consisted of a film made of the norbornene resin and the liquid-crystalline thermoplastic resin dispersed therein as domains of almost the same shape elongated along the stretch direction. The average diameter of these domains was determined through an examination with a polarizing microscope based on coloration by phase difference. As a result, the $\Delta n^2$-direction average length thereof was found to be 5 µm.

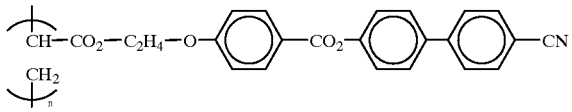

Subsequently, a transparent ITO film having a thickness of 100 nm was deposited as an anode on one side of a glass substrate by sputtering. The anode film was cleaned by ultrasonic cleaning and then ultraviolet ozone cleaning. This glass substrate was set in a vacuum deposition apparatus of the resistance heating type, and films were deposited thereon in the following manner. The vacuum chamber was evacuated to $1 \times 10^{-4}$ Pa, and N,N'-diphenyl-N,N'-bis(3-methylphenyl)-1,1'-biphenyl-4,4'-diamine (TPD) placed in a molybdenum boat was heated at 220° C. to deposit a 60 nm-thick TPD film as a hole-transporting layer on the ITO film. Furthermore, tris(8-quinolinol)aluminum (Alq) placed in a molybdenum boat was heated at 275° C. to deposit a 60 nm-thick Alq film thereon. Thereafter, the pressure inside the vacuum chamber was adjusted to $2 \times 10^{-4}$ Pa, and magnesium placed in a molybdenum boat and silver placed in another molybdenum boat were subjected to simultaneous binary deposition to form on the Alq film a 140 nm-thick cathode film consisting of an Mg—Ag alloy (Mg/Ag=9/1). Thus, an organic EL element emitting a green light (main wavelength, 513 nm) was formed. The polarized-light scattering film obtained above was bonded to the back side of the glass electrode substrate of the organic EL element through an acrylic pressure-sensitive adhesive layer to obtain an organic EL device. In forming the organic EL element, the electrode substrate was kept at room temperature.

EXAMPLE 2

In a 20 wt % dichloromethane solution containing 950 parts of a polycarbonate resin having a glass transition temperature of 150° C. (Panlite, manufactured by Teijin Ltd.) was dissolved 50 parts of a liquid-crystalline thermoplastic resin represented by the following formula which had a glass transition temperature of 90° C. and showed a nematic liquid-crystal phase in the temperature range of from 120 to 290° C. From this solution was obtained a 70 µm-thick film by casting. This film was stretched at 160° C. in a stretch ratio of 2 and then rapidly cooled to obtain a polarized-light scattering film having refractive index differences $\Delta n^1$ and $\Delta n^2$ of 0.012 and 0.151, respectively. An organic EL device was obtained in the same manner as in Example 1, except that this polarized-light scattering film was used.

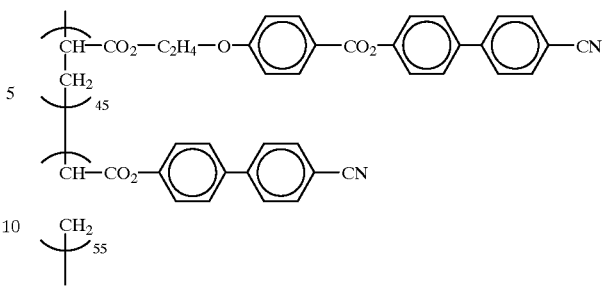

The polarized-light scattering film obtained above consisted of a film made of the polycarbonate resin and the liquid-crystalline thermoplastic resin dispersed therein as domains of almost the same shape elongated along the stretch direction. The average diameter of these domains was determined through an examination with a polarizing microscope based on coloration by phase difference. As a result, the $\Delta n^2$-direction average length thereof was found to be 6 µm.

EXAMPLE 3

An organic EL element was produced in the same manner as in Example 1, except that the polarized-light scattering film was used as an electrode substrate in place of the glass substrate. This EL element was used alone as an organic EL device.

COMPARATIVE EXAMPLE

An organic EL element was produced in the same manner as in Example 1, except that the polarized-light scattering film was omitted. This EL element was used as an organic EL device.

Evaluation Test

A DC voltage of 6.5 V was applied to the electrodes of each of the organic EL devices obtained in the Examples and Comparative Example, and the quantity of light emitted from the polarized-light scattering film side (Examples) or the electrode substrate side (Comparative Example) was measured with a luminance meter having an integrating sphere. Furthermore, a commercial iodine-containing polarizing film was disposed on the polarized-light scattering film (Examples) or electrode substrate (Comparative Example) of each EL device and this structure also was examined for the quantity of emitted light in the same manner. In the Examples, the polarizing film was disposed so that the axis of transmission thereof was parallel to $\Delta n^2$ directions for the polarized-light scattering film.

The results obtained are shown in the following table, wherein the found values of quantity of light are given as relative values, with the quantity of light for the EL device of Comparative Example having no polarizing film being taken as 100.

| | Quantity of light emitted | |
| --- | --- | --- |
| | Without polarizing film | With polarizing film |
| Example 1 | 310 | 220 |
| Example 2 | 280 | 184 |
| Example 3 | 190 | 115 |
| Comparative Example | 100 | 40 |

The table shows that due to the polarized-light scattering film disposed, the organic EL devices of the Examples had a greatly improved quantity of light emitted. A comparison between the EL devices having a polarizing film and those not having a polarizing film shows that in the EL devices of the Examples, the polarized light emitted therefrom passed through the polarizing film with a reduced absorption loss to attain a greatly improved quantity of light emitted. The quantity of light emitted in Example 1 was 5.5 times that in Comparative Example. By using this EL device as the backlight of a liquid-crystal display or the like, exceedingly bright display images can be obtained.

What is claimed is:

1. A polarized-light emitting organic electroluminescent device comprising an organic electroluminescent element and a polarized-light scattering film which comprises a light-transmitting resin and dispersedly contained therein minute regions differing from the light-transmitting resin in birefringent characteristics and in which the difference in refractive index between the minute regions and the light-transmitting resin in the axis direction in which a linearly polarized light has a maximum transmittance, $\Delta n^1$, is smaller than 0.03 and that in a direction perpendicular to the $\Delta n^1$ direction, $\Delta n^2$, is from 0.03 to 0.5, the light produced by the organic electroluminescent element being emitted from the device through the polarized-light scattering film, the polarized light being emitted from the device through the polarized-light scattering film;

wherein the minute regions of the polarized-light scattering film which are dispersedly contained in the light-transmitting resin are formed by phase separation and have a $\Delta n^2$-direction length of from 0.5 to 50 μm as measured in the $\Delta n^2$-direction.

2. The polarized-light emitting organic electroluminescent device of claim 1, wherein the polarized-light scattering film constitutes an electrode substrate for the organic electroluminescent element or is superposed on the electrode substrate.

3. The polarized-light emitting organic electroluminescent device of claim 1, wherein the minute regions of the polarized-light scattering film comprise a thermoplastic resin which has a glass transition temperature of 50° C. or higher and shows a nematic liquid-crystal phase in a range of temperatures lower than the glass transition temperature of the light-transmitting resin.

4. The polarized-light emitting organic electroluminescent device of claim 1, wherein the light-transmitting resin of the polarized-light scattering film has a deformation-under-load temperature of 80° C. or higher and a glass transition temperature of 110° C. or higher.

5. A polarizing surface light source comprising the polarized-light emitting organic electroluminescent device of claim 1, which has an illuminating planar surface and emits a polarized light.

6. The polarizing surface light source of claim 5, which has at least one of a polarizing film and a retardation film on the light emission side or opposite side of the polarized-light emitting organic electroluminescent device.

7. The polarizing surface light source of claim 6, wherein the axis of transmission of the polarizing film or the axis of retardation of the retardation film is parallel or perpendicular to the $\Delta n^2$ direction of the polarized-light scattering film.

8. The polarizing surface light source of claim 5, which has on the light emission side at least one of a light diffuser film and a lens sheet each having the property of maintaining polarization.

9. A liquid-crystal display which comprises the polarizing surface light source of claim 5 and a liquid-crystal cell disposed on the light emission side of the light source.

\* \* \* \* \*